United States Patent
Kim et al.

(10) Patent No.: US 9,899,097 B2
(45) Date of Patent: Feb. 20, 2018

(54) NONVOLATILE MEMORY DEVICE AND METHOD OF PROGRAMMING THE SAME

(71) Applicant: SAMSUNG ELECTRONICS CO., LTD., Suwon-si, Gyeonggi-do OT (KR)

(72) Inventors: Youngmin Kim, Seoul (KR); Il Han Park, Suwon-si (KR); Sung-Won Yun, Suwon-si (KR); Hyejin Yim, Wonju-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/381,724

(22) Filed: Dec. 16, 2016

(65) Prior Publication Data

US 2017/0178740 A1  Jun. 22, 2017

(30) Foreign Application Priority Data

Dec. 18, 2015 (KR) ........................ 10-2015-0181882

(51) Int. Cl.
G11C 16/34 (2006.01)
G11C 11/56 (2006.01)
G11C 16/08 (2006.01)
G11C 16/10 (2006.01)

(52) U.S. Cl.
CPC ...... *G11C 16/3459* (2013.01); *G11C 11/5671* (2013.01); *G11C 16/08* (2013.01); *G11C 16/10* (2013.01); *G11C 16/3481* (2013.01)

(58) Field of Classification Search
CPC .. G11C 16/3459; G11C 16/10; G11C 13/0064
USPC ..................................................... 365/185.03
See application file for complete search history.

(56) References Cited

U.S. PATENT DOCUMENTS

| | | |
|---|---|---|
| 7,679,133 B2 | 3/2010 | Son et al. |
| 7,808,836 B2 | 10/2010 | Murin et al. |
| 8,223,556 B2 | 7/2012 | Dutta et al. |
| 8,553,466 B2 | 10/2013 | Han et al. |
| 8,559,235 B2 | 10/2013 | Yoon et al. |
| 8,654,587 B2 | 2/2014 | Yoon et al. |
| 8,717,823 B2 | 5/2014 | Kim et al. |
| 8,879,329 B2 | 11/2014 | Moschiano et al. |
| 8,891,296 B2 | 11/2014 | Ma |
| 9,042,177 B2 | 5/2015 | Aritome |
| 2010/0027336 A1* | 2/2010 | Park .................... G11C 11/5628 365/185.09 |
| 2010/0074015 A1 | 3/2010 | Chandrasekhar et al. |
| 2010/0254193 A1 | 10/2010 | Park et al. |
| 2011/0141818 A1 | 6/2011 | Li |
| 2011/0233648 A1 | 9/2011 | Seol et al. |

(Continued)

*Primary Examiner* — Huan Hoang
*Assistant Examiner* — Minh Dinh
(74) *Attorney, Agent, or Firm* — F. Chau & Associates, LLC

(57) ABSTRACT

A nonvolatile memory device is provided as follows. A memory cell array includes a plurality of memory cells. An address decoder provides a first verify voltage to selected memory cells among the plurality of memory cells in a first program loop and provides a second verify voltage to the selected memory cells in a second program loop. A control logic determines the second program loop as a verify voltage offset point in which the first verify voltage is changed to the second verify voltage based on a result of a verify operation of the first program loop.

20 Claims, 12 Drawing Sheets

(56) References Cited

U.S. PATENT DOCUMENTS

2013/0336057 A1* 12/2013 Chung ................ G11C 16/10
                                                365/185.03
2016/0260490 A1*  9/2016 Lee .................. G11C 16/0466

* cited by examiner

| Pass/Fail Count at Loop1 | Offset Point |
|---|---|
| REF1 ≤ Off-cell Bit < REF2 | Loop6 |
| REF2 ≤ Off-cell Bit < REF3 | Loop5 |
| REF3 ≤ Off-cell Bit < REF4 | Loop4 |
| REF4 ≤ Off-cell Bit | Loop3 |

NONVOLATILE MEMORY DEVICE AND METHOD OF PROGRAMMING THE SAME

CROSS-REFERENCE TO RELATED APPLICATION

This application claims priority under 35 U.S.C. § 119 to Korean Patent Application No. 10-2015-0181882, filed on Dec. 18, 2015, the disclosure of which is incorporated by reference herein in its entirety.

TECHNICAL FIELD

The present inventive concept relates to a nonvolatile memory device and a method of programming the same.

DISCUSSION OF RELATED ART

A semiconductor memory device is classified into a volatile memory device and a nonvolatile memory device.

A volatile memory device has a high read/write speed but loses its stored data when its power is interrupted. A nonvolatile memory device retains its stored data even when its power is interrupted. Thus, a nonvolatile memory device is used to store data that should be preserved regardless of whether or not a power is supplied. Examples of nonvolatile memory devices include mask read only memory (MROM) devices, programmable ROM (PROM) devices, erasable and programmable ROM (EPROM) devices, and electrically erasable and programmable ROM (EEPROM) devices.

A flash memory device may be a single-bit cell or a single-level cell (SLC) of which each memory cell stores 1-bit data or a multi-bit cell or a multi-level cell (MLC) of which each memory cell stores multi-bit (two or more bits) data. As the demand for high integration of a memory device increases, a study on a multi-level flash memory that stores multi-level data in one memory cell is proceeding actively.

SUMMARY

According to an exemplary embodiment of the present inventive concept, a nonvolatile memory device is provided as follows. A memory cell array includes a plurality of memory cells. An address decoder provides a first verify voltage to selected memory cells among the plurality of memory cells in a first program loop and provides a second verify voltage to the selected memory cells in a second program loop. A control logic determines the second program loop as a verify voltage offset point in which the first verify voltage is changed to the second verify voltage based on a result of a verify operation of the first program loop.

According to an exemplary embodiment of the present inventive concept, a nonvolatile memory device is provided as follows. A memory cell array includes a plurality of memory cells. Each of the plurality of memory cells has a program state of a plurality of program states. An address decoder provides a first verify voltage to selected memory cells among the plurality of memory cells in a first program loop and provides a second verify voltage to the selected memory cells in a second program loop. A control logic determines the second program loop as a verify voltage offset point in which the first verify voltage is changed to the second verify voltage based on whether a program of a specific program state is completed in the first program loop.

According to an exemplary embodiment of the present inventive concept, a nonvolatile memory device is provided as follows. A memory cell array includes a plurality of memory cells. Each of the plurality of memory cells has M program states including an erase state and M is an integer greater than two. Each of the plurality of memory cells is programmed to one of the M program states using a plurality of program loops including a first program loop and a second program loop. A pass/fail counter counts a memory cell having a verification result of a first verify voltage among (M-1) verify voltages in the first program loop. A verify level offset point controller determines the second program loop based on the counting result of the verification result of the first program loop. A changed second verify voltage reduced from a second verify voltage is applied in a verification operation of the second program loop.

BRIEF DESCRIPTION OF THE FIGURES

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
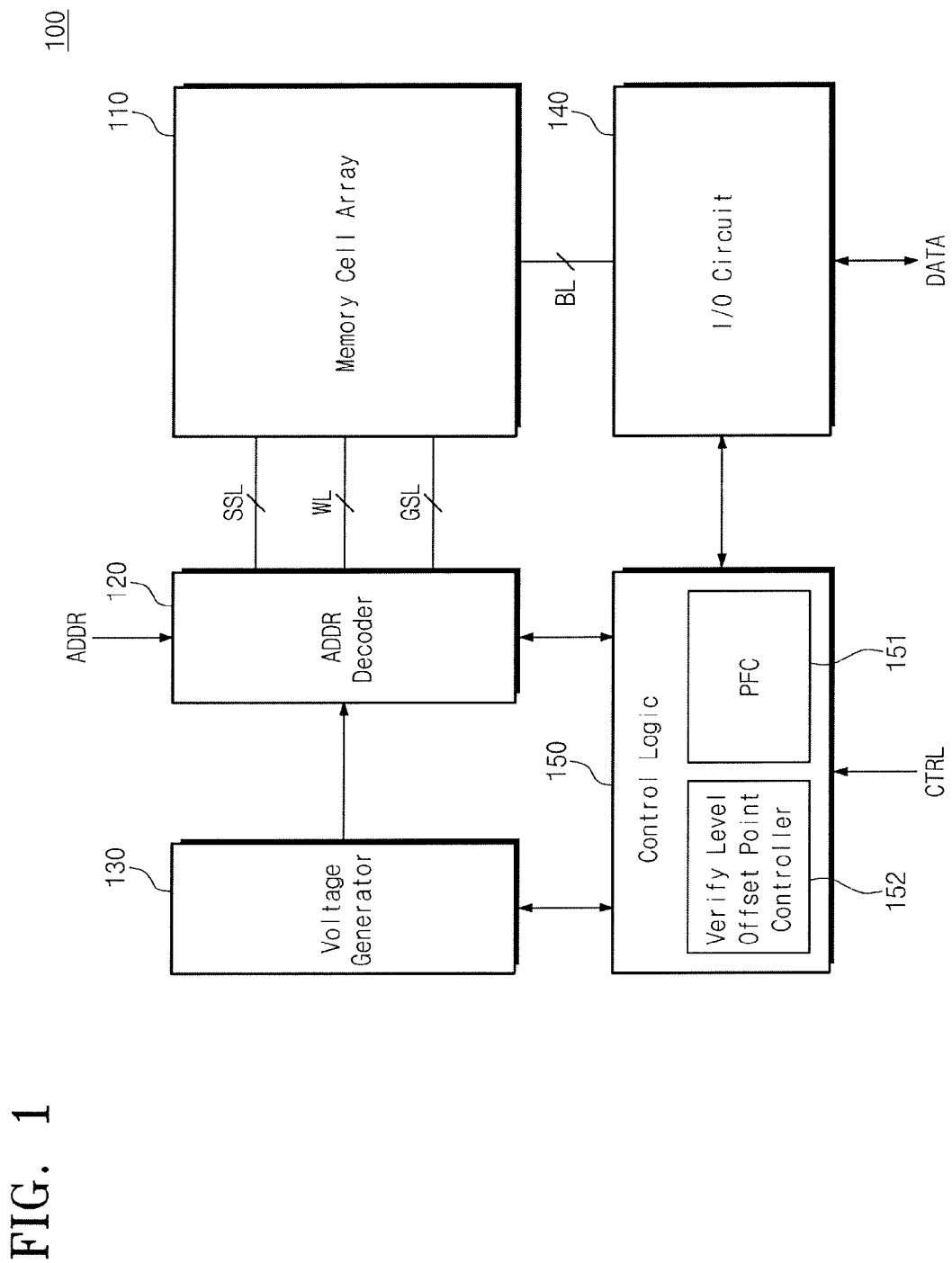
FIG. 1 is a block diagram illustrating a nonvolatile memory device in accordance with an exemplary embodiment of the present inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

FIG. 1 is a block diagram illustrating a nonvolatile memory device in accordance with an exemplary embodiment of the inventive concept. Referring to FIG. 1, a nonvolatile memory device 100 may include a memory cell array 110, an address decoder 120, a voltage generator 130, an input/output circuit 140, and control logic 150.

The memory cell array 110 is connected to the address decoder 120 through string select lines SSL, word lines WL, and ground select lines GSL. The memory cell array 110 is connected to the input/output circuit 140 through bit lines BL. The memory cell array 110 may include a plurality of memory blocks. In an exemplary embodiment, memory cells of each memory block may form a two-dimensional structure. In an exemplary embodiment, memory cells of each memory block may be laminated in a direction perpendicular to a substrate to form a three-dimensional structure. Each memory block may include a plurality of memory cells and a plurality of select transistors. The memory cells may be connected to the word lines WL and the select transistors may be connected to the string select lines SSL or the ground select lines GSL. Memory cells of each memory block may store one or more bits.

The address decoder 120 is connected to the memory cell array 110 through the string select lines SSL, the word lines WL, and the ground select lines GSL. The address decoder 120 is configured to operate in response to a control of the control logic 150. The address decoder 120 receives an address ADDR from the outside.

The address decoder 120 is configured to decode a row address among the received addresses ADDR. The address decoder 120 selects the string select lines SSL, word lines WL, and ground select lines GSL using the decoded row address. The address decoder 120 may receive various voltages from the voltage generator 130 and transmit the received voltages to selected and unselected string select lines SSL, the word lines WL, and the ground select lines GSL respectively.

The address decoder 120 may be configured to decode a column address among the transmitted addresses ADDR. The decoded column address may be transmitted to the input/output circuit 140. The address decoder 120 may include constituent elements such as a row decoder, a column decoder, an address buffer, etc.

The voltage generator 130 is configured to generate various voltages required from the nonvolatile memory device 100. For example, the voltage generator 130 may generate a plurality of program voltages, a plurality of pass voltages, a plurality of verify voltages, a plurality of select read voltages, and a plurality of unselect read voltages.

The input/output circuit 140 may be connected to the memory cell array 110 through the bit lines BL and exchange data with the outside. The input/output circuit 140 operates according to control of the control logic 150.

The input/output circuit 140 receives data DATA from the outside and writes the received data DATA to the memory cell array 110. The input/output circuit 140 reads data DATA from the memory cell array 110 and transmits the read data DATA to the outside. The input/output circuit 140 may read data DATA from a first storage area of the memory cell array 110 and write the read data DATA to a second storage area of the memory cell array 110. For example, the input/output circuit 140 may be configured to perform a copy-back operation.

The input/output circuit 140 may include constituent elements such as a page buffer (or page register), a column select circuit, a data buffer, etc. The input/output circuit 140 may include constituent elements such as a sense amplifier, a write driver, a column select circuit, a data buffer, etc.

The control logic 150 may be connected to the address decoder 120, the voltage generator 130, and the input/output circuit 140. The control logic 150 is configured to control all operations of the nonvolatile memory device 100. The control logic 150 operates in response to a control signal CTRL transmitted from a memory controller.

The control logic 150 may include a pass/fail counter 151 and a verify level offset point controller 152. In a verify operation, the pass/fail counter 151 may receive program pass or fail information from the input/output circuit 140. The pass/fail counter 151 may counter the number of program-passed memory cells or program-failed memory cells based on the program pass or fail information. For example, the pass/fail counter 151 may count the number of off-cells which fail using a program voltage. The pass/fail counter 151 may count the number of on-cells which pass using a program voltage. The verify level offset point controller 152 may receive the number of on-cells or off-cells from the pass/fail counter 151. The verify level offset point controller 152 may compare the number of on-cells or off-cells with a reference value to determine a verify level offset point when a verify voltage is adjusted with an offset voltage. For example, the verify level offset point controller 152 may determine which program loop is operated using a verify voltage adjusted with an offset voltage. Accordingly, the voltage generator 130 may change the verify voltage at the verify level offset point. The verify level offset point means a program loop in which a program voltage is adjusted with an offset voltage of which amount is determined based on the number of off-cells or on cells.

The nonvolatile memory device 100 may perform a program operation according to an ISPP (incremental step pulse programming) method. In the case of performing a program operation according to the ISPP method, cell-speeds of memory cells may be different from one another. The cell-speed of the memory cell means the degree of increase of a threshold voltage of the memory cell after the memory cell is programmed using a program voltage. For example, when applying a low program voltage, a cell-speed of a verify-passed memory cell is high. When applying a high program voltage, a cell-speed of a verify-passed memory cell is low. However, a memory cell having a high cell-speed is verify-passed when a low program voltage is applied to the memory cell, the memory cell has a low threshold voltage in a threshold voltage distribution of a program state. Since a memory cell having a high cell-speed is verify-passed when a high program voltage is applied to the memory cell, the memory cell has a high threshold voltage in a threshold voltage distribution of a program state.

The nonvolatile memory device 100 may change a verify voltage at a specific time to generate a threshold voltage distribution of a program state corresponding to the changed verify voltage. For example, the nonvolatile memory device 100 may lower a verify voltage at a specific time to narrow a threshold voltage distribution of memory cells. For example, when the verify voltage is reduced, a threshold voltage of memory cells having a high cell-speed among memory cells already verify-passed drops. For example, without using the reduced verify voltage according to an exemplary embodiment, the threshold voltage of memory cells having the high cell-speed may increase the threshold voltage with a higher program voltage in the next program loop. According to an exemplary embodiment, an over-programming of the memory cells with high cell-speed may be prevented using a reduced verify voltage.

The nonvolatile memory device 100 may adaptively control the time to change a verify voltage based on cell-speeds of memory cells. For example, the nonvolatile memory device 100 may count the number of on-cells or off-cells in a verify operation. The nonvolatile memory device 100 may determine which program loop is performed using a changed verify voltage based on the number of on-cells or off-cells. Thus, the nonvolatile memory device 100 may adaptively generate a threshold voltage distribution of a program state according to characteristics of different memory cells depending on various factors.

Figure 2:
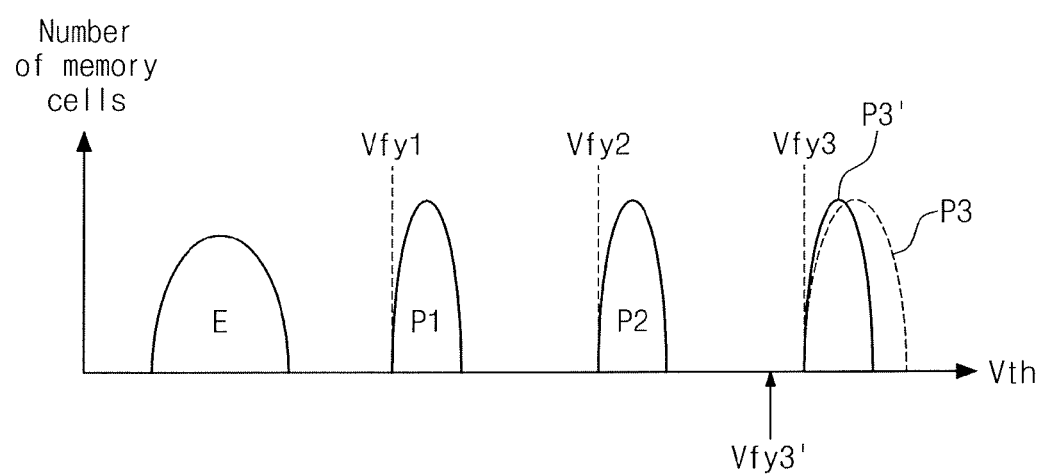
FIG. 2 illustrates an example that threshold voltages of memory cells are formed according to a program operation.

FIG. 2 illustrates an example that threshold voltages of memory cells are formed according to a program operation. In FIG. 2, a horizontal axis represents threshold voltages of memory cells while a vertical axis represents the number of memory cells. For example, a threshold voltage distribution of memory cells generated after a program operation is performed is illustrated in FIG. 2. FIG. 2 illustrates a threshold voltage distribution of a MLC that stores 2-bit information as an illustration.

Referring to FIG. 2, after a program operation is performed, memory cells may have an erase state E, a first program state P1, a second program state P2, and a third program state P3. For example, the memory cells may have a threshold voltage of a corresponding program state after a plurality of program loops in the program operation is performed.

Memory cells may be programmed according to the ISPP method. In the case where memory cells are programmed according to the ISPP method, as a program loop proceeds, a program voltage increases stepwise. Cell-speeds of the memory cells may be different from one another. The cell-speed of the memory cell means the degree of increase of a threshold voltage of the memory cell at program voltage. For example, when applying a low program voltage, a cell-speed of a verify-passed memory cell is high. When applying a high program voltage, a cell-speed of a verify-passed memory cell is low. However, since the memory cell having a high cell-speed is verify-passed when a low program voltage is applied, it has a low threshold voltage in a threshold voltage distribution of a program state. Since the memory cell having a high cell-speed is verify-passed when a high program voltage is applied, it has a high threshold voltage in a threshold voltage distribution of a program state.

In FIG. 2, in the case of performing a verify operation using a third verify voltage Vfy3, the third program state P3 may have a threshold voltage distribution illustrated by a dotted line. In this case, if a verify operation is performed with respect to the third program state P3 using a third-prime verify voltage Vfy3' smaller than the third verify Vfy3, a threshold voltage distribution may have a third-prime program state P3'. Thus, the threshold voltage distribution P3' of the third program state P3 may have less spread distribution than the threshold voltage distribution P3. For the convenience of description, a threshold voltage distribution change with respect to the third program state P3 is described. The present inventive concept is not limited thereto. For example, the threshold voltage distribution change may applied to the first and second program states P1 and P2.

Figure 3:
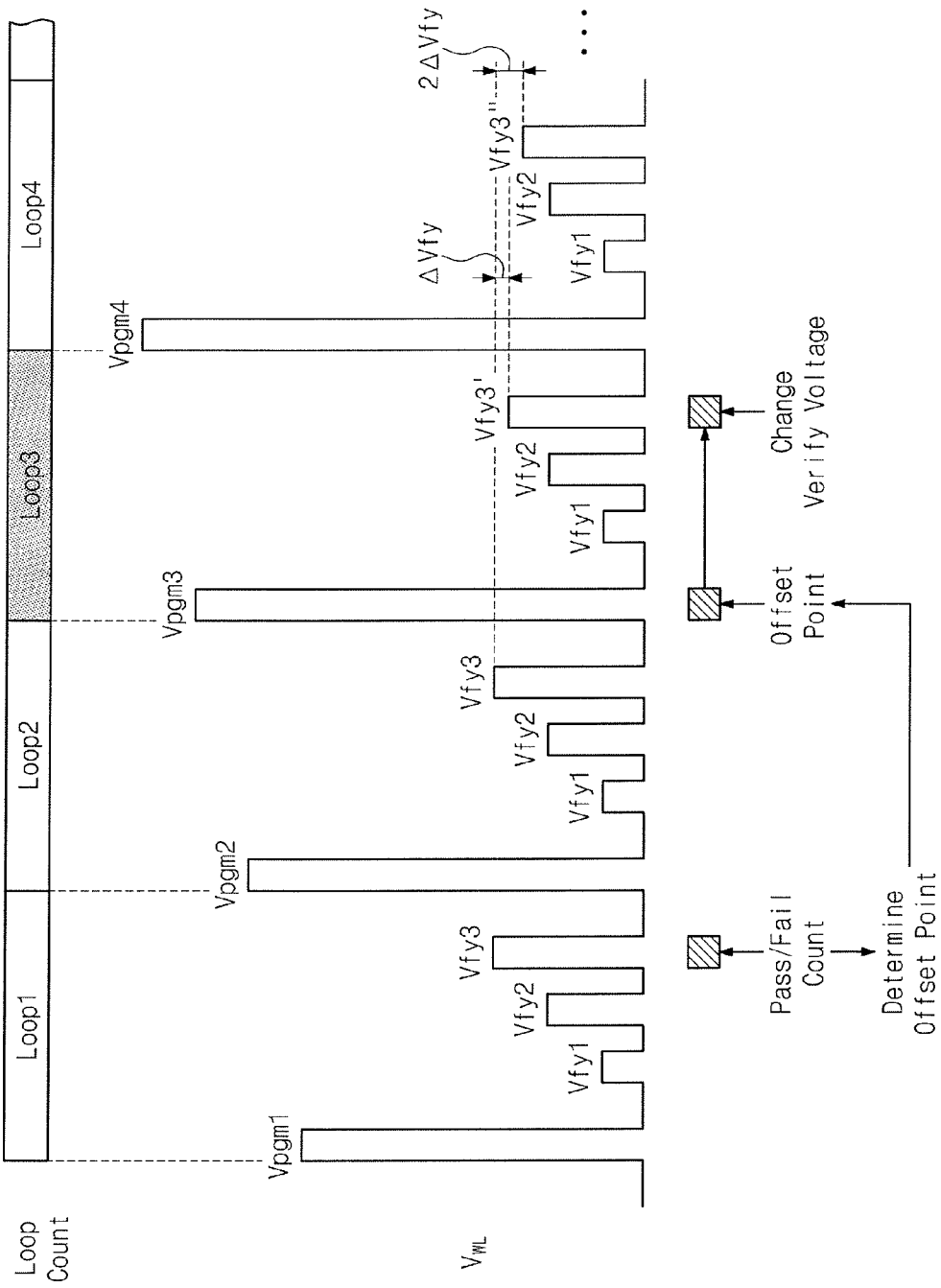
FIG. 3 is a drawing illustrating a method of programming a nonvolatile memory device in accordance with an exemplary embodiment of the present inventive concept.

FIG. 3 is a drawing illustrating a method of programming a nonvolatile memory device in accordance with example embodiments of the inventive concept. Referring to FIG. 3, memory cells may be programmed through a plurality of program loops (Loop1~Loop4). As a program loop count increases, program voltages (Vpgm1~Vpgm4) may increase. For the convenience of description, four program loops are described. The present inventive concept is not limited thereto. For example, more program loops than the four program loops may be applied to program memory cells.

The nonvolatile memory device 100 may count a program pass/fail of memory cells when a verify operation is performed using the third verify voltage Vfy3 in the first program loop Loop1. The nonvolatile memory device 100 may determine an offset point at which the third verify voltage Vfy3 is changed on the basis of a program pass/fail count result of the memory cells. For example, the nonvolatile memory device 100 may count the number of off-cells using the third verify voltage Vfy3. The nonvolatile memory device 100 may compare the counted number of off-cells with predetermined reference values. The nonvolatile memory device 100 may determine a third program loop Loop3 as an offset point according to a comparison result of the counted number of off-cells and one of the predetermined reference values.

The nonvolatile memory device 100 may change a verify voltage at the offset point (Loop3). For example, the third verify voltage Vfy3 corresponding to the third program state P3 may be changed into the third-prime verify voltage Vfy3'. In this case, an offset voltage is $\Delta Vfy$. The verify voltage may be reduced by the offset voltage $\Delta Vfy$. After the offset point, the verify voltage may be reduced stepwise. However, a reduction method of the verify voltage is not limited thereto. For example, the verify voltage may be reduced using a plurality of offset voltages. For example, a verify voltage may be changed once and then the changed verify voltage may be maintained in a program operation.

Figures 4, 5:
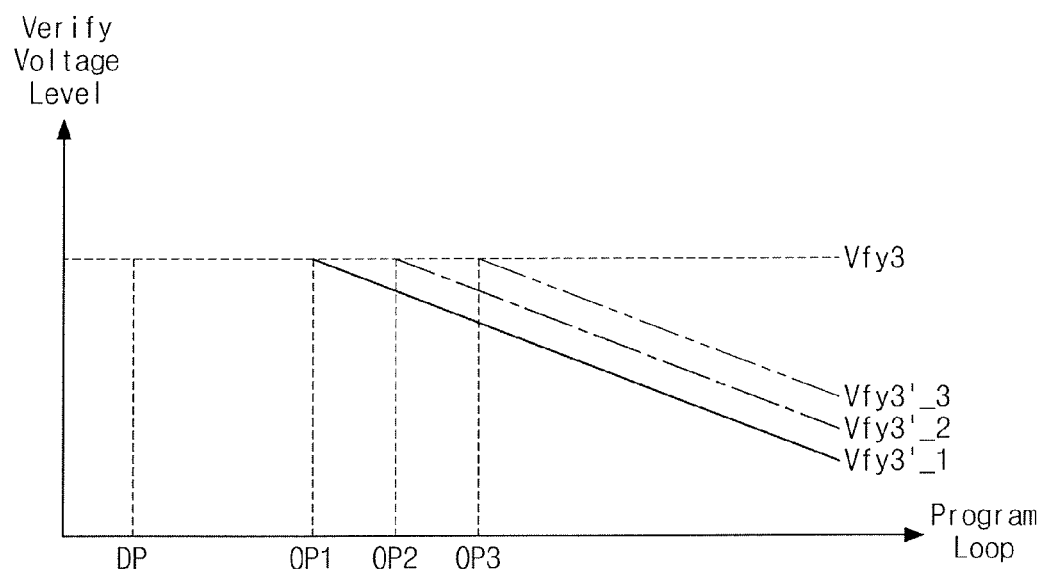
FIG. 4 is a drawing illustrating a method of adaptively determining an offset time of a verify voltage of FIG. 3.
FIG. 5 is a table illustrating a method of adaptively determining an offset time of a verify voltage of FIG. 3.

FIG. 4 is a drawing illustrating a method of adaptively determining an offset time of a verify voltage of FIG. 3. In FIG. 4, a horizontal axis represents the number of times of program loops, and a vertical axis represents a verify voltage level. FIG. 4 illustrates the third verify voltage Vfy3 of FIG. 3 as an illustration. Thus, the first and second verify voltages Vfy1 and Vfy2 may determine an offset point in a similar manner.

As the number of times of program loops increases, the nonvolatile memory device 100 may increase a program voltage stepwise to apply the increased program voltage. Although the number of times of program loops increases, the third verify voltage Vfy3 is maintained constant. If not applying an offset voltage, the nonvolatile memory device 100 maintains the third verify voltage Vfy3 in all the program loops. For example, the third verify voltage Vfy3 is maintained as constant before the offset point of FIG. 3, and is changed to lower third verify voltage depending on an offset voltage.

The nonvolatile memory device 100 may count a program pass/fail of memory cells using the third verify voltage Vfy3 at a verify level offset decision point DP. For example, the verify level offset decision point DP may be within the first loop Loop1 as shown in FIG. 3. The nonvolatile memory device 100 may determine offset points (OP1, OP2, OP3) at which the verify voltage is changed according to the count result of the program pass/fail of the memory cells using the third verify voltage Vfy3. For example, the nonvolatile memory device 100 may count the number of on-cells or off-cells after applying the third verify voltage Vfy3 at the verify level offset decision point DP. The nonvolatile memory device 100 may compare the number of on-cells or off-cells with predetermined reference values to select one of the offset points (OP1, OP2, OP3).

Thus, the nonvolatile memory device 100 may adaptively determine an offset point of the verify voltage. For example, the nonvolatile memory device 100 may adaptively determine an offset point of the verify voltage in consideration of a wear level, a surrounding environment, a characteristic difference between chips, etc.

FIG. 5 is a table illustrating a method of adaptively determining an offset point of a verify voltage of FIG. 3. Referring to FIG. 5, the nonvolatile memory device 100 may perform a pass/fail count of memory cells of the third program state P3 in the first program loop Loop1. For example, the nonvolatile memory device 100 may apply the third verify voltage Vfy3 in the first program loop Loop1 to count the number of off-cell bits.

The smaller the number of off-cell bits is, the nonvolatile memory device 100 may determine a later time as an offset point. For example, in the case where the number of off-cell bits is equal to or greater than a first reference value REF1 and is smaller than a second reference value REF2, the nonvolatile memory device 100 may determine a sixth loop Loop6 as the offset point. In the case where the number of off-cell bits is equal to or greater than the second reference value REF2 and is smaller than a third reference value REF3, the nonvolatile memory device 100 may determine a fifth loop Loop5 as the offset point. In the case where the number of off-cell bits is equal to or greater than the third reference value REF3 and is smaller than a fourth reference value REF4, the nonvolatile memory device 100 may determine the fourth loop Loop4 as the offset point. In the case where the number of off-cell bits is equal to or greater than the fourth reference value REF4, the nonvolatile memory device 100 may determine the third loop Loop3 as the offset point.

Figure 6:
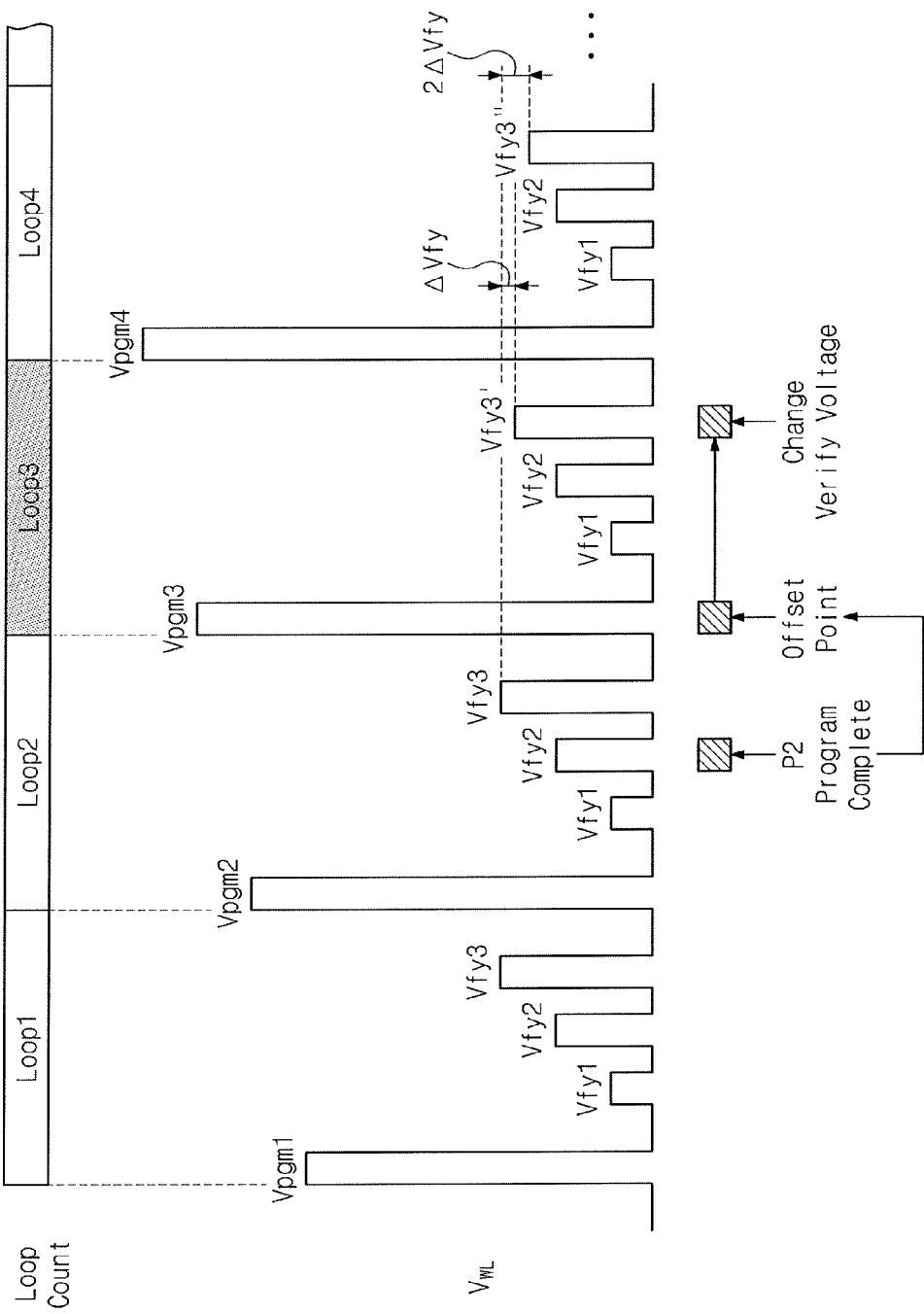
FIG. 6 is a drawing illustrating a method of programming a nonvolatile memory device in accordance with an exemplary embodiment of the present inventive concept.

FIG. 6 is a drawing illustrating a method of programming a nonvolatile memory device in accordance with other example embodiments of the inventive concept. Referring to FIG. 6, memory cells may be programmed through a plurality of program loops (Loop1~Loop4). As a program loop count increases, program voltages (Vpgm1~Vpgm4) may increase. For the convenience of description, four program loops are described. The present inventive concept is not limited thereto. For example, more program loops than the four program loops may be applied to program memory cells.

The nonvolatile memory device 100 may check whether a program of memory cells corresponding to the second program state P2 in the second program loop Loop2 is completed. For example, if the number of pass/fail counts of a second verify voltage Vfy2 corresponding to the second program state P2 is less than a predetermined number, the program of the second program state P2 is indicated as completed at the second program loop Loop2. The present inventive concept is not limited thereto. For example, the first program state P1 may be indicated as completed. In a case where the nonvolatile memory device has program states more than 4, the third program state P3 may be indicated as completed. The nonvolatile memory device 100 may determine an offset point at which the third verify voltage Vfy3 is changed based on whether a program of memory cells corresponding to the second program state P2 is completed. For example, in the case where a program of memory cells corresponding to the second program state P2 is completed, the nonvolatile memory device 100 may determine the third program loop Loop3 as the offset point. For example, the starting of the third program loop Loop3 may be set as the offset point.

The nonvolatile memory device 100 may change a verify voltage at the offset point (Loop3). For example, the third verify voltage Vfy3 corresponding to the third program state P3 may be changed into the third-prime verify voltage Vfy3'. In this case, an offset voltage is $\Delta$Vfy. The verify voltage may be reduced by the offset voltage $\Delta$Vfy. After the offset point, the verify voltage may be reduced stepwise. The present inventive concept is not limited thereto. In an exemplary embodiment, the verify voltage may be reduced using a plurality of offset voltages. In an exemplary embodiment, a verify voltage may be maintained after the verify voltage is changed once.

Figure 7:
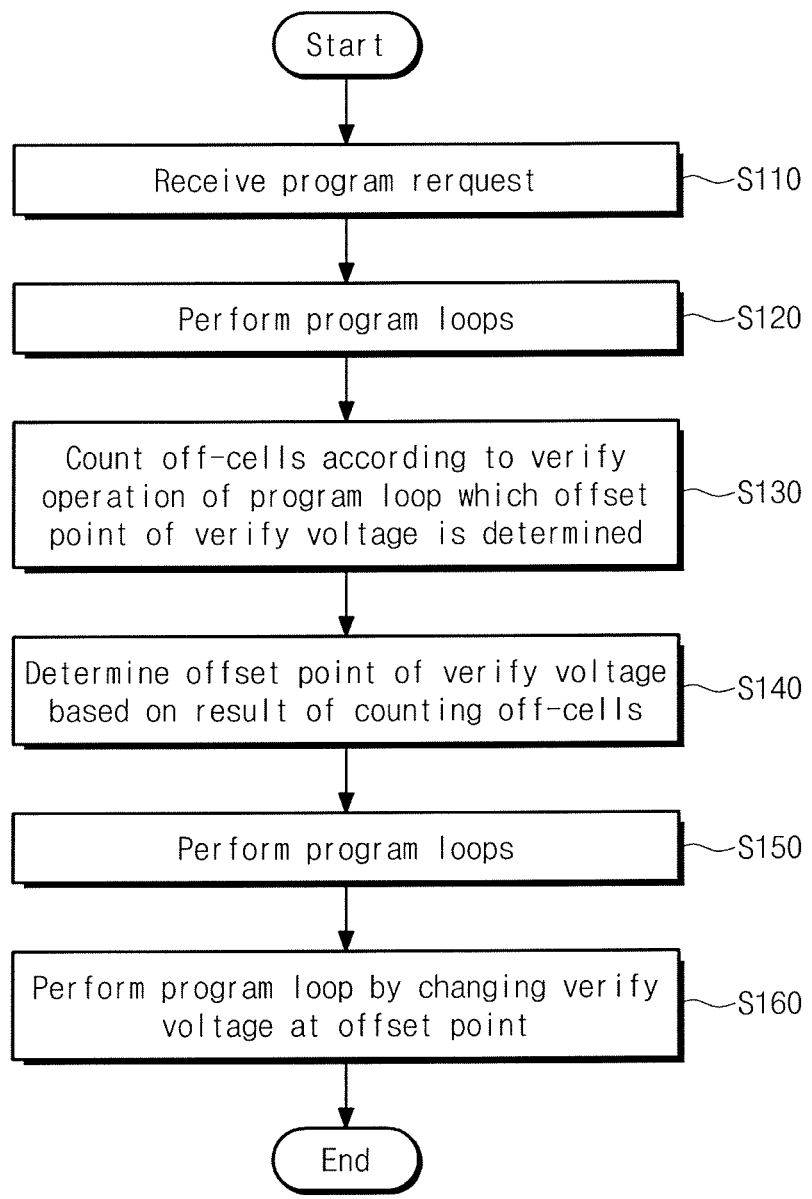
FIG. 7 is a flowchart illustrating a method of adaptively determining an offset time of a verify voltage in accordance with an exemplary embodiment of the present inventive concept.

FIG. 7 is a flowchart illustrating a method of adaptively determining an offset point of a verify voltage in accordance with example embodiments of the present inventive concept. Referring to FIG. 7, the nonvolatile memory device 100 may adaptively control the time to apply an offset voltage to a verify voltage based on cell speeds of memory cells.

In an operation S110, the nonvolatile memory device 100 may receive a program request. For example, the control logic 150 may receive a control signal CTRL corresponding to a program command. The input/output circuit 140 may receive data DATA to be programmed.

In an operation S120, the nonvolatile memory device 100 may perform program loops according to the received data DATA. For example, as the number of times of program loops increases, the nonvolatile memory device 100 may increase a program voltage using the ISPP method. The nonvolatile memory device 100 may use the same verify voltage during at least one program loop.

In an operation S130, the nonvolatile memory device 100 may count the number of off-cells in a specific program loop according to a verify operation. For example, the pass/fail counter 151 may count the number of off-cells corresponding to the verify voltage after applying the verify voltage in the specific program loop. In an exemplary embodiment, the specific program loop may be the first loop. In an exemplary embodiment, the specific programs may be a program loop in which programming of the second program state P2, for example, is completed.

In an operation S140, the nonvolatile memory device 100 may determine an offset point of the verify voltage based on a counting result of the off-cells measured in the operation S130. For example, the verify level offset point controller 152 may compare the counted number of off-cells with a reference value. The verify level offset point controller 152 may also determine the offset point of the verify voltage using a plurality of reference values. The offset point may be a program loop immediately following the program loop that determines the offset point. The offset point may also be a program loop after the specific number of program loops is performed after the program loop that determines the offset point. For example, the nonvolatile memory device 100 may adaptively determine the time to apply an offset voltage to the verify voltage based on the number of off-cells measured in the operation S130. The program loop that determines the offset point may be the first program loop of a program operation. The program loop that determines the offset point may also be a program loop after the specific number of program loops is passed after the program operation begins.

In an operation S150, the nonvolatile memory device 100 may perform program loops. For example, the nonvolatile memory device 100 may perform at least one program loop using the same verify voltage as that in the operation S120. In the case where the offset point is a program loop immediately following the program loop that determines the offset point, the operation S150 may be omitted.

In an operation S160, the nonvolatile memory device 100 may perform a program loop by changing the verify voltage at the offset point of the verify voltage. For example, if the program loop reaches the program loop determined in the operation S140, the nonvolatile memory device 100 may apply the offset voltage to the verify voltage to perform the verify operation. Thus, the nonvolatile memory device 100 may generate a less-spread threshold voltage distribution of memory cells as discussed with respect to FIG. 2.

Figure 8:
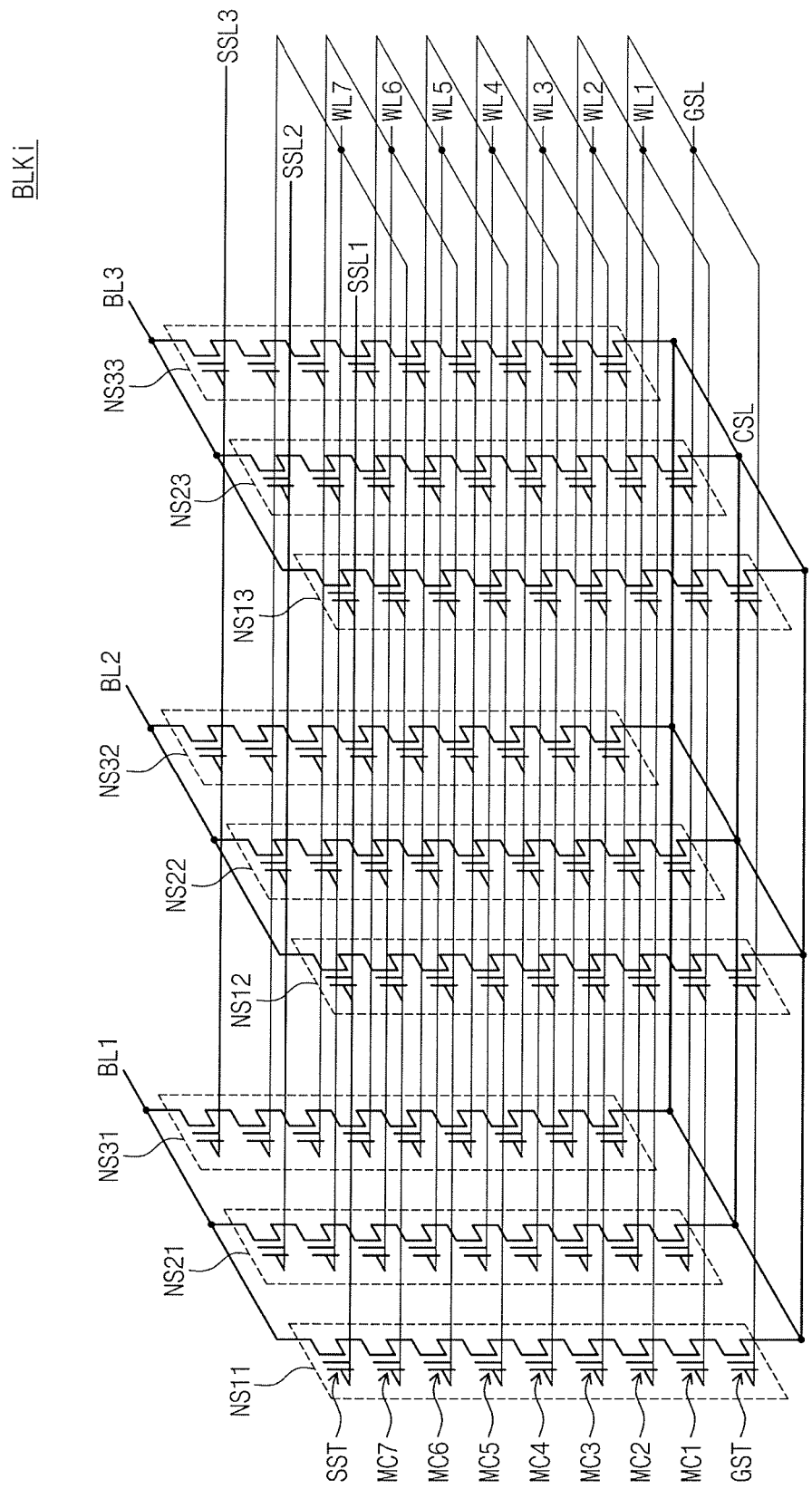
FIG. 8 is a circuit diagram illustrating one (BLKi) among memory blocks of a memory cell array of FIG. 1.

FIG. 8 is a circuit diagram illustrating one (BLKi) among memory blocks of a memory cell array of FIG. 1. Referring to FIG. 8, the memory block BLKi may have a three-dimensional structure. For example, NAND strings NS11, NS21, and NS31 may be provided between a first bit line BL1 and a common source line CSL. NAND strings NS12, NS22, and NS32 may be provided between a second bit line BL2 and the common source line CSL. NAND strings NS13, NS23, and NS33 may be provided between a third bit line BL3 and the common source line CSL.

Each NAND string NS may include a string select transistor SST, a ground select transistor GST, and a plurality of memory cells MC connected between the string select transistor SST and the ground select transistor GST. The string select transistor SST of each NAND string NS may be connected to a corresponding bit line BL. The ground select transistor GST of each NAND string NS may be connected to the common source line CSL.

The NAND strings NS are defined by a row unit and a column unit. NAND strings NS connected to one bit line in common form one column. For example, the NAND strings NS11, NS21 and NS31 connected to a first bit line BL1 correspond to a first column. The NAND strings NS12, NS22 and NS32 connected to a second bit line BL2 correspond to a second column. The NAND strings NS13, NS23 and NS33 connected to a third bit line BL3 correspond to a third column.

NAND strings NS connected to one string select line SSL form one row. For example, the NAND strings NS11, NS12, and NS13 connected to a first string select line SSL1 form a first row. The NAND strings NS21, NS22, and NS23 connected to a second string select line SSL2 form a second row. The NAND strings NS31, NS32, and NS33 connected to a third string select line SSL3 form a third row.

In each NAND string NS, a height is defined. In each NAND string NS, a height of a memory cell MC1 adjacent to the ground select transistor GST is 1. In each NAND string NS, as a memory cell is closer to the string select transistor SST, a height of the memory cell increases. In each NAND string NS, a height of a memory cell MC7 adjacent to the string select transistor SST is 7.

NAND strings NS of the same row share the string select line SSL. NAND strings NS of different rows are connected to different string select lines SSL. The NAND strings (NS11~NS13, NS21~NS22, NS31~NS33) share the ground select line GSL. Memory cells of the same height of NAND strings NS of the same row share a word line. At the same height, word lines WL of NAND strings NS of different rows are connected in common. The common source line CSL is connected to the NAND strings NS in common.

As illustrated in FIG. 8, word lines WL of the same height are connected in common. Thus, when a specific word line is selected, NAND strings NS connected to the specific word line are all selected. NAND strings NS of different rows are connected to different string select lines SSL. Thus, by selecting the string select lines (SSL1~SSL3), NAND strings NS of an unselect row among NAND strings NS connected to the same word line WL are separated from the bit lines (BL1~BL3). For example, by selecting the string select lines (SSL1~SSL3), a row of the NAND strings NS may be selected. By selecting the bit lines (BL1~BL3), NAND strings NS of a select row may be selected by a column unit.

Figure 9:
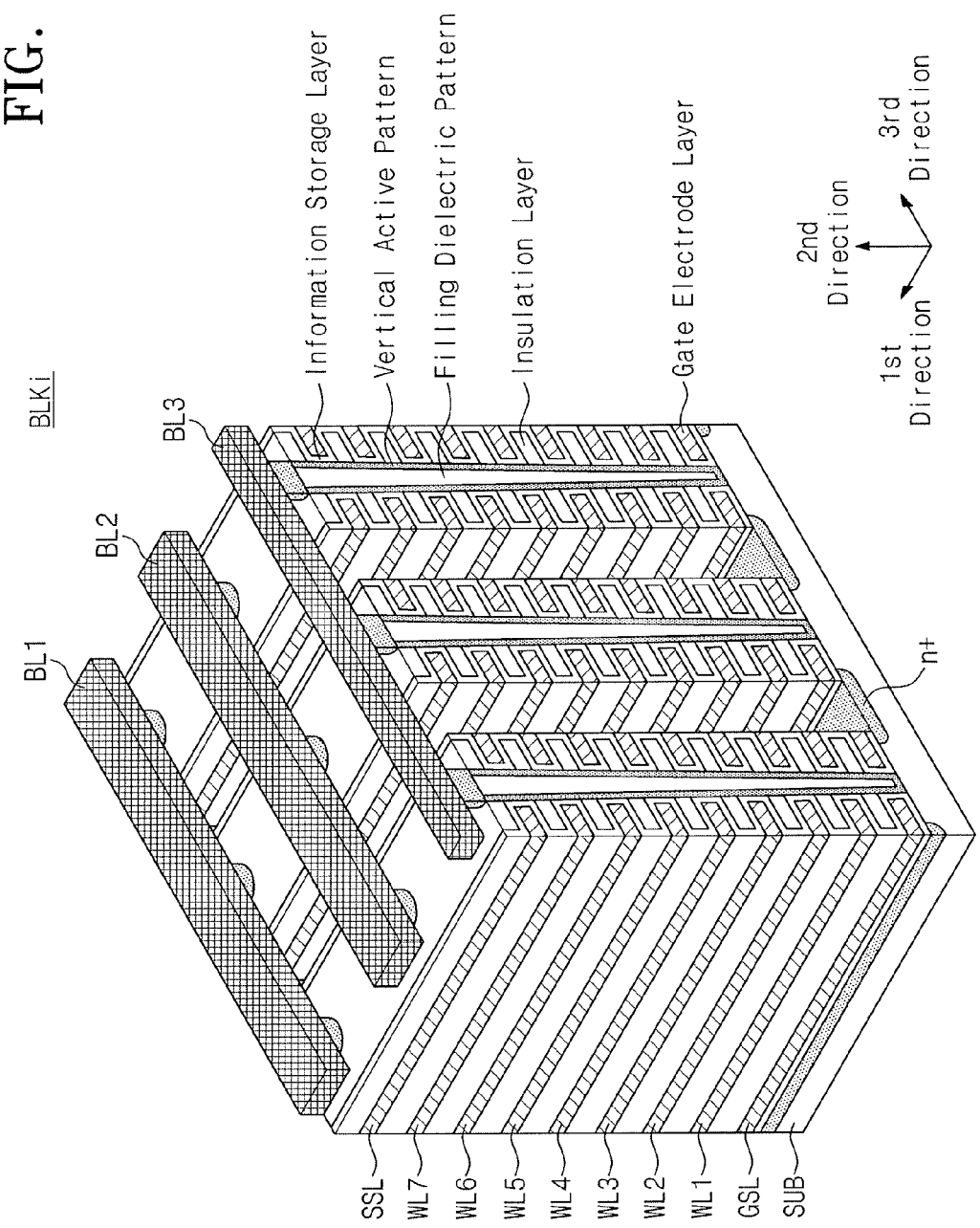
FIG. 9 is a perspective view illustrating an exemplary structure corresponding to the memory block (BLKi) of FIG. 8.

FIG. 9 is a perspective view illustrating an embodiment of a structure corresponding to the memory block (BLKi) of FIG. 8. Referring to FIG. 9, the memory block BLKi may be formed in a direction perpendicular to a substrate SUB. An n+ doping region may be formed in the substrate SUB.

A gate electrode layer and an insulation layer are alternately deposited on the substrate SUB. An information storage layer may be formed between the gate electrode layer and the insulation layer. A pillar of a V character shape may be formed by pattering the gate electrode layer and the insulation layer in a vertical direction. The pillar may penetrate the gate electrode layer and the insulation layer to be connected to the substrate SUB. The inside of the pillar is a filling dielectric pattern and may be constituted by an insulation material like silicon oxide. The outside of the pillar is a vertical active pattern and may be constituted by channel semiconductor.

The gate electrode layer of the memory block BLKi may be connected to a ground select line GSL, a plurality of word lines (WL1~WL7), and a string select line SSL. The pillar of the memory block BLKi may be connected to a plurality of bit lines (BL1~BL3). In FIG. 8, one memory block BLKi is illustrated to have two select lines (SSL, GSL), seven word lines WL, and three bit lines (BL1~BL3). However, the memory block BLKi may have more than this or less than this.

Figure 10:
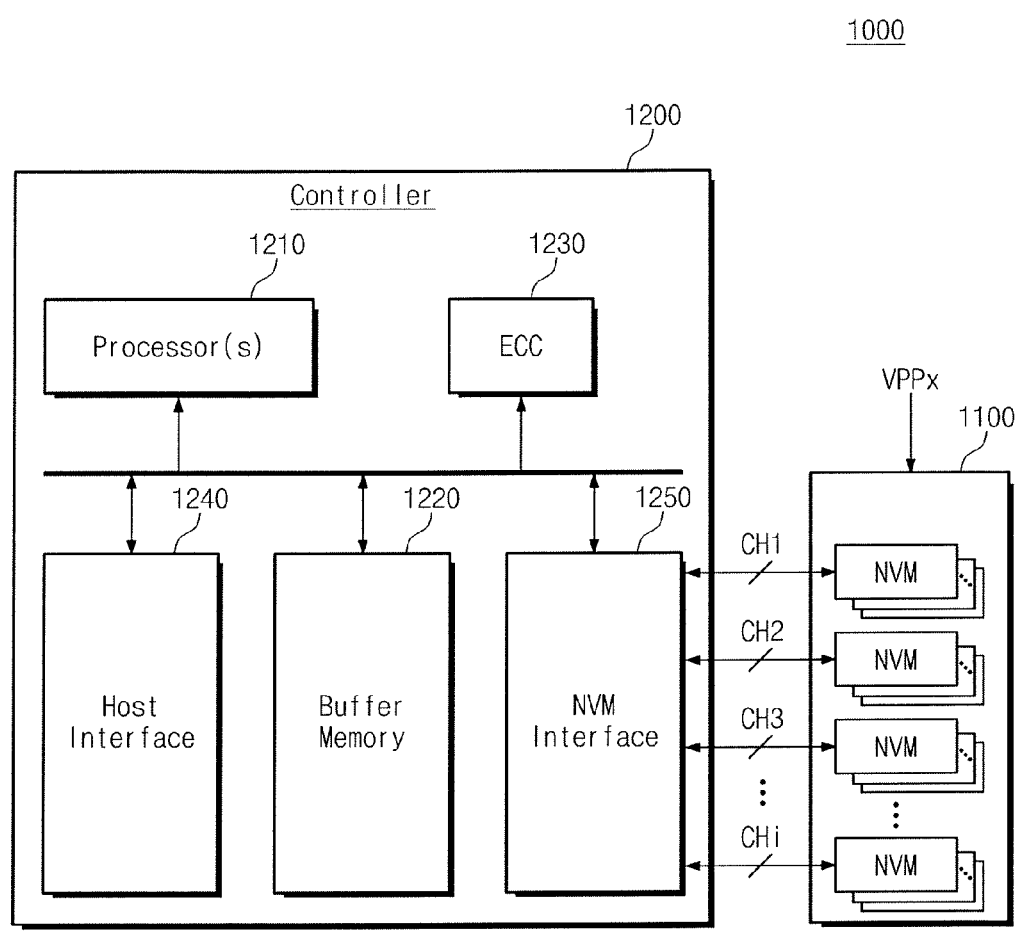
FIG. 10 is a block diagram illustrating a solid state drive (SSD) in accordance with an exemplary embodiment of the present inventive concept.

FIG. 10 is a block diagram illustrating a solid state drive (SSD) in accordance with example embodiments of the present inventive concept. Referring to FIG. 10, an SSD 1000 may include a plurality of nonvolatile memory devices 1100 and a SSD controller 1200.

The nonvolatile memory devices 1100 may receive an external high voltage VPPx. Each of the nonvolatile memory devices 1100, as described in FIGS. 1 through 9, may adaptively determine an offset point of a verify voltage based on a program speed of memory cells to improve a threshold voltage distribution of the memory cells.

The SSD controller 1200 may be connected to the nonvolatile memory devices 1100 through a plurality of channels (CH1~CHi, i is an integer which is 2 or greater). The SSD controller 1200 may include at least one processor 1210, a buffer memory 1220, an error correction circuit 1230, a host interface 1240, and a nonvolatile memory interface 1250.

The buffer memory 1220 temporarily stores data needed to drive the SSD controller 1200. The buffer memory 1220 may include a plurality of memory lines that stores data or command.

The error correction circuit 1230 may calculate an error correction code value of data to be programmed in a write operation, correct an error of read data based on the error correction code value in a read operation, and correct an error of data recovered from the nonvolatile memory device 1100. Although not illustrated in the drawing, a code memory that stores code data needed to drive the SSD controller 1200 may be further included. In an exemplary embodiment, a nonvolatile memory device may store the code data.

The host interface 1240 may provide an interface function with an external device. The host interface 1240 may be a NAND interface. The nonvolatile memory interface 1250 may provide an interface function with the nonvolatile memory device 1100.

Figure 11:
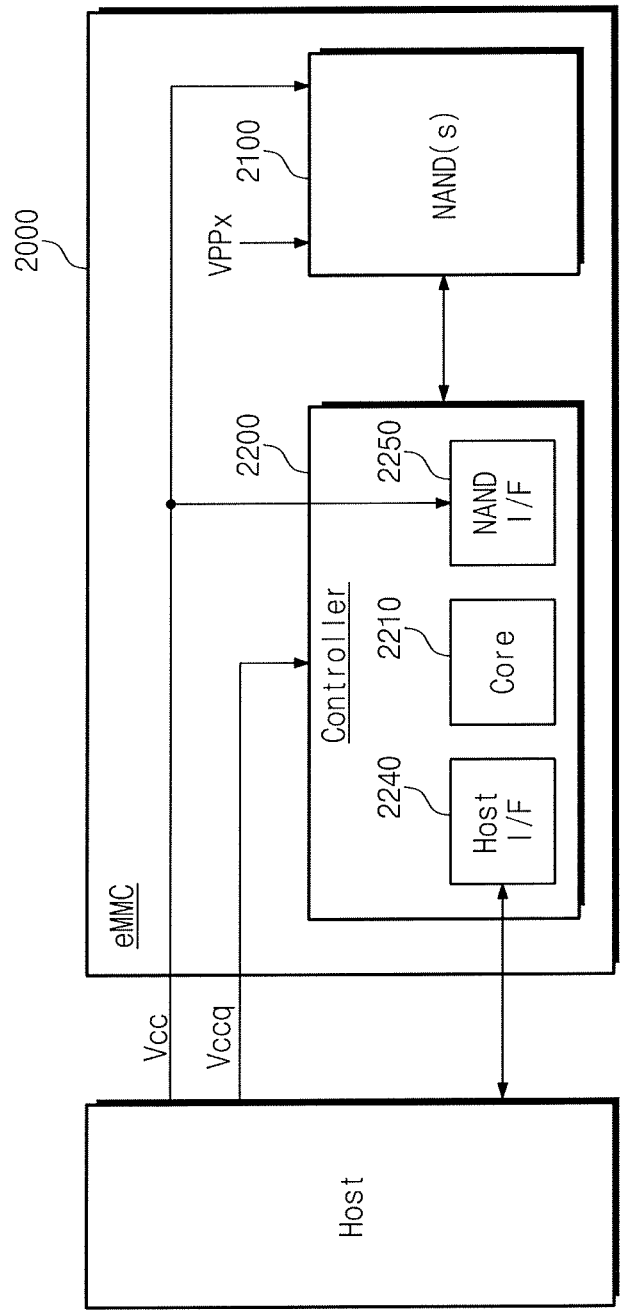
FIG. 11 is a block diagram illustrating an eMMC in accordance with an exemplary embodiment of the present inventive concept.

FIG. 11 is a block diagram illustrating an embedded multimediaCard (eMMC) in accordance with example embodiments of the present inventive concept. Referring to FIG. 11, an eMMC 2000 may include at least one NAND flash memory device 2100 and a controller 2200.

The NAND flash memory device 2100 may be a SDR (single data rate) NAND or a DDR (double data rate) NAND. The NAND flash memory device 2100 may be a vertical NAND flash memory device (VNAND). The NAND flash memory device 2100, as described in FIGS. 1 through 9, may adaptively determine an offset application point of a verify voltage based on a program speed of memory cells to generate a less-spread threshold voltage distribution of the memory cells.

The controller 2200 may be connected to the NAND flash memory device 2100 through a plurality of channels. The controller 2200 may include at least one controller core 2210, a host interface 2240, and a NAND interface 2250. The at least one controller core 2210 may control an overall operation of the eMMC 2000. The host interface 2240 may perform an interfacing of a host with the controller 2200. In an embodiment, the host interface 2240 may be a parallel interface (e.g., MMC interface). In another embodiment, the host interface 2240 may be a serial interface (e.g., UHS-II, UFS interface).

The eMMC 2000 may receive power supply voltages (Vcc, Vccq) from the host. A first power supply voltage Vcc (e.g., 3.3V) may be provided to the NAND flash memory device 2100 and the NAND interface 2250. A second power supply voltage Vccq (e.g., 1.8V/3.3V) may be provided to the controller 2200. The eMMC 2000 may selectively receive the external high voltage VPPx.

Figure 12:
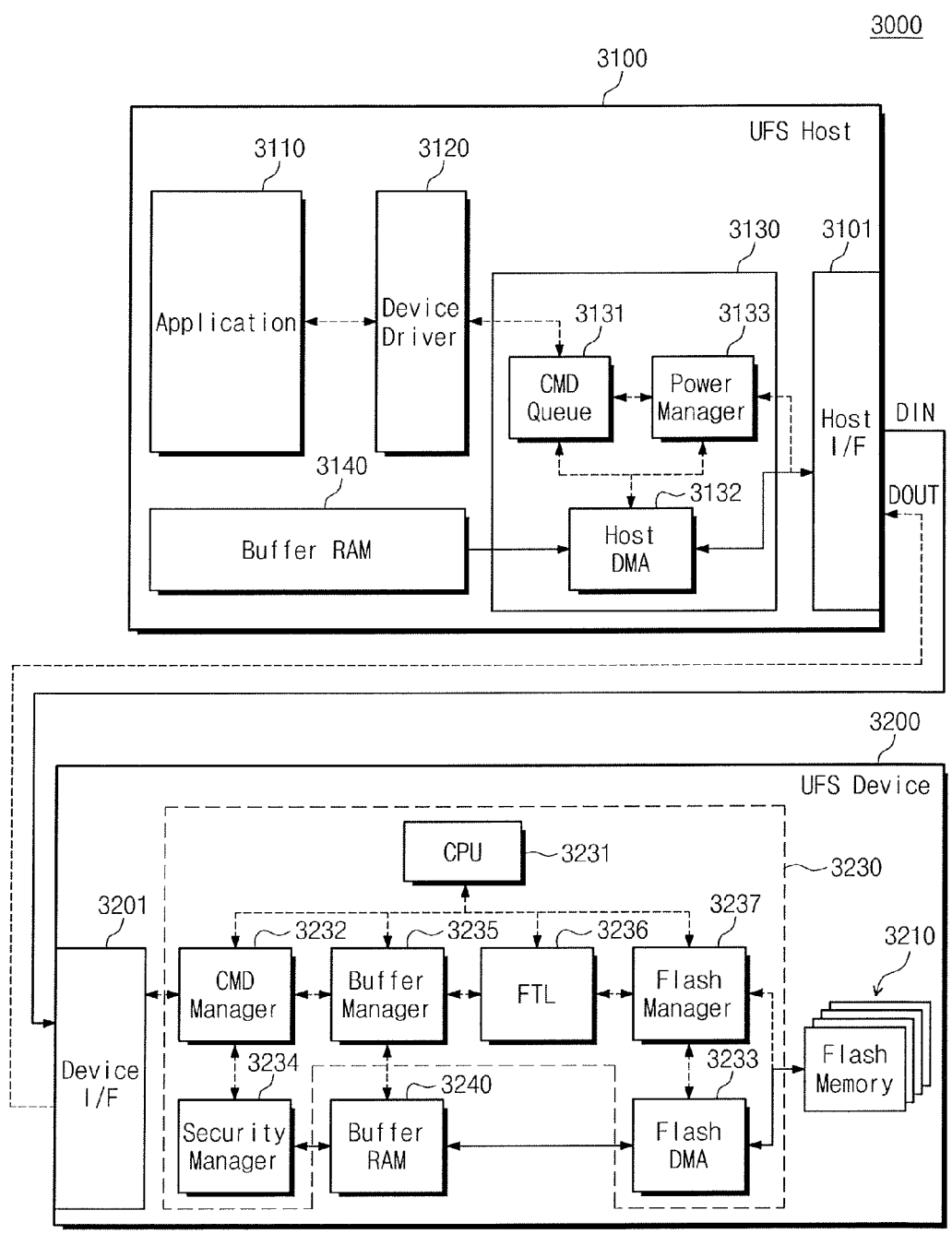
FIG. 12 is a block diagram illustrating a UFS system in accordance with am exemplary embodiment of the present inventive concept.

The inventive concept is applicable to a UFS (universal flash storage). FIG. 12 is a block diagram illustrating a UFS system in accordance with example embodiments of the inventive concept. Referring to FIG. 12, a UFS system 3000 may include a UFS host 3100 and a UFS device 3200.

The UFS host 3100 may include an application 3110, a device driver 3120, a host controller 3130, and a buffer RAM 3140. The host controller 3130 may include a command (CMD) queue 3131, a host DMA 3132, and a power manager 3133. The CMD queue 3131, the host DMA 3132, and the power manager 3133 may operate using algorithm, software, or firmware in the host controller 3130.

An application of the UFS host 3100 and a command (e.g., write command) generated from the device driver 3120 may be input to the CMD queue 3131 of the host controller 3130. The CMD queue 3131 may store a command to be provided to the UFS device 3200 in order. A command stored in the command CMD queue 3130 may be provided to the host DMA 3132. The host DMA 3132 transmits a command to the UFS device 3200 through a host interface 3101.

The UFS device 3200 may include a flash memory 3210, a device controller 3230, and a buffer RAM 3240. The device controller 3230 may include a CPU (central processing unit) 3231, a command (CMD) manager 3232, a flash DMA 3233, a security manager 3234, a buffer manager 3235, a FTL (flash translation layer) 3236, and a flash manager 3237. The CMD manager 3232, the security manager 3234, the buffer manager 3235, the FTL 3236, and the flash manager 3237 may operate using algorithm, software, or firmware in the device controller 3230.

The flash memory 3210, as described in FIGS. 1 through 9, may adaptively determine an offset application point of a verify voltage based on a program speed of memory cells to generate a less-spread threshold distribution of the memory cells.

A command that is input to the UFS device 3200 from the UFS host 3100 may be provided to the CMD manager 3232 through the device interface 3201. The CMD manager 3232 may interpret the command provided from the UFS host 3100 and confirm the inputted command using the security manager 3234. The CMD manager 3232 may allocate the buffer RAM 3240 to receive data through the buffer manager 3235. When a data transmission preparation is finished, the CMD manager 3232 transmits a RTT (ready_to_transfer) UPIU to the UFS host 3100.

The UFS host 3100 may transmit data to the UFS device 3200 in response to the RTT UPIU. The data may be transmitted to the UFS device 3200 through the host DMA 3132 and the host interface 3101. The UFS device 3200 may store the received data in the buffer RAM 3240 through the buffer manager 3235. The data stored in the buffer RAM 3240 may be provided to flash manager 3237 through the flash DMA 3233. The flash manager 3237 may data in a selected address of the flash memory 3210 with reference to address mapping information of the FTL 3236.

When a data transmission and a program which are necessary for a command is completed, the UFS device 3200 transmits a response that informs a command completion to the UFS host 3100 through an interface. The UFS host 3100 may inform the device driver 3120 and the application 3110 of whether the command of the response is completed and finish an operation with respect to the corresponding command.

Figure 13:
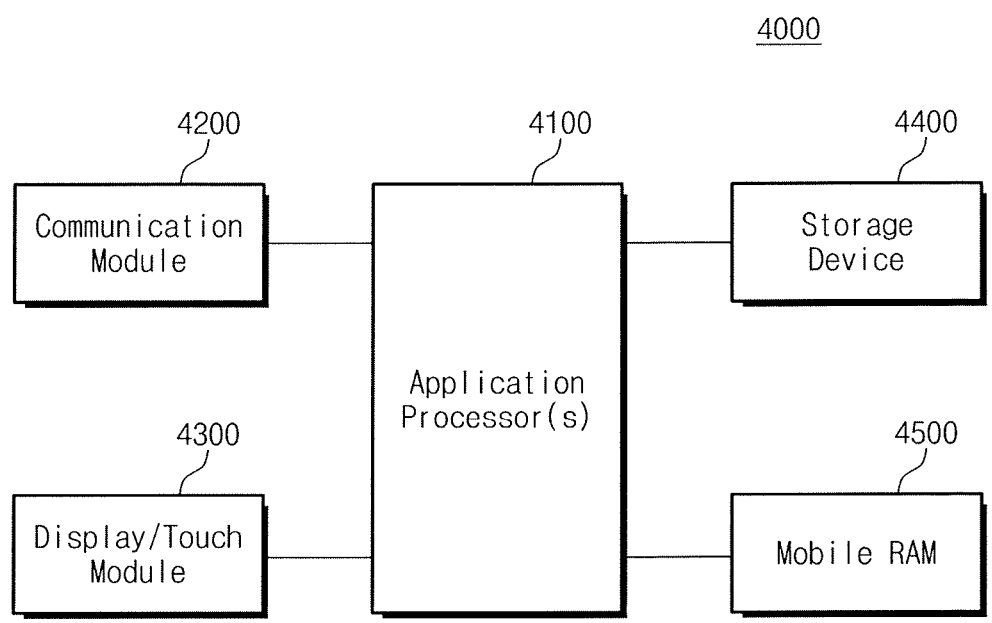
FIG. 13 is a block diagram illustrating a mobile device in accordance with an exemplary embodiment of the present inventive concept.

The inventive concept is applicable to a mobile device. FIG. 13 is a block diagram illustrating a mobile device in accordance with example embodiments of the inventive concept. Referring to FIG. 13, a mobile device 4000 may include an application processor 4100, a communication module 4200, a display/touch module 4300, a storage device 4400, and a mobile RAM 4500.

The application processor 4100 may control an overall operation of the mobile device 4000. The communication module 4200 may be embodied to control a wired/wireless communication with the outside. The display/touch module 4300 may be embodied to display data processed in the application processor 4100 or receive data from a touch panel. The storage device 4400 may be embodied to store data of a user. The storage device 4400 may be an eMMC device, a SSD device, or a UFS device. The mobile RAM 4500 may be embodied to temporarily store data needed in an operation of processing the mobile device 4000.

The storage device 4400 as described in FIGS. 1 through 9, may adaptively determine an offset application point of a verify voltage based on a program speed of memory cells to generate a less-spread threshold voltage distribution of the memory cells.

According to example embodiments of the present inventive concept, a nonvolatile memory device that adaptively control the time to apply an offset to a verify voltage among a plurality of program loops to generate a threshold voltage distribution of memory cells which is more reliable and a program method thereof.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A nonvolatile memory device comprising:
a memory cell array including a plurality of memory cells;
an address decoder providing a first verify voltage to selected memory cells among the plurality of memory cells in a first program loop and providing a second verify voltage to the selected memory cells in a second program loop; and
a control logic determining the second program loop as a verify voltage offset point in which the first verify voltage is changed to the second verify voltage based on a result of a verify operation of the first program loop, wherein a number of off-cells of the first program loop is used to select the second program loop, from a plurality of program loops, as the verify voltage offset point.

2. The nonvolatile memory device of claim 1, wherein the control logic comprises a pass/fail counter that counts the number of off-cells of the first program loop based on the result of a verify operation of the first program loop.

3. The nonvolatile memory device of claim 2, wherein the control logic further comprises a verify level offset point controller that determines the second program loop as the verify voltage offset point based on the number of off-cells of the first program loop.

4. The nonvolatile memory device of claim 2, wherein if the number of off-cells of the first program loop is equal to or greater than a first reference value and is smaller than a second reference value, the control logic determines the second program loop as the verify voltage offset point.

5. The nonvolatile memory device of claim 4, wherein if the number of off-cells of the first program loop is equal to or greater than the second reference value, the control logic determines the second program loop as the verify voltage offset point.

6. The nonvolatile memory device of claim 1, wherein the control logic reduces the first verify voltage by a first offset voltage to change the first verify voltage to the second verify voltage in the second program loop.

7. The nonvolatile memory device of claim 6, wherein the control logic reduces the first verify voltage by a second offset voltage twice the first offset voltage in a program loop following the second program loop.

8. The nonvolatile memory device of claim 1, further comprising:
a voltage generator that generates the first verify voltage and the second verify voltage according to a control of the control logic.

9. The nonvolatile memory device of claim 1, wherein each of the memory cells comprises a charge trap layer.

10. A nonvolatile memory device comprising:
a memory cell array including a plurality of memory cells, wherein each of the plurality of memory cells has a program state of a plurality of program states;
an address decoder providing a first verify voltage to selected memory cells among the plurality of memory cells in a first program loop and providing a second verify voltage to the selected memory cells in a second program loop; and
a control logic determining the second program loop as a verify voltage offset point in which the first verify voltage is changed to the second verify voltage based on whether a program of a specific program state is completed in the first program loop, wherein a counted number of off-cells of the first program loop is used to select the second program loop, from a plurality of program loops, as the verify voltage offset point.

11. The nonvolatile memory device of claim 10, wherein if the program of the specific program state is completed in the first program loop, the second program loop is a program loop immediately following the first program loop.

12. The nonvolatile memory device of claim 10, wherein if a program of a first program state is completed in the first program loop, the control logic changes a verify voltage corresponding to a program state adjacent to the first program state in the second program loop.

13. The nonvolatile memory device of claim 10, wherein the control logic causes to reduce the first verify voltage by a first offset voltage to the second verify voltage in the second program loop.

14. The nonvolatile memory device of claim 13, wherein the control logic causes to reduce the first verify voltage by a second offset voltage twice the first offset voltage in a program loop following the second program loop.

15. The nonvolatile memory device of claim 10, wherein a program voltage of the second program loop is set to be higher than a program voltage of the first program loop.

16. A nonvolatile memory device, comprising:
a memory cell array including a plurality of memory cells, wherein each of the plurality of memory cells has M program states including an erase state and M is an integer greater than two and wherein each of the plurality of memory cells is programmed to one of the M program states using a plurality of program loops including a first program loop and a second program loop;
a pass/fail counter counting a number of off-cells having a verification result of a first verify voltage among (M-1) verify voltages in the first program loop; and
a verify level offset point controller selecting the second program loop as the verify voltage offset point from a plurality of program loops based on the number of off-cells of the first program loop, wherein a changed second verify voltage reduced from a second verify voltage is applied in a verification operation of the second program loop.

17. The nonvolatile memory device of claim 16, further comprising: a voltage generator generating the changed second verify voltage according to control of the verify level offset point controller.

18. The nonvolatile memory device of claim 16, wherein the verification result corresponds to a verify state of failing to pass a verify operation using the first verify voltage.

19. The nonvolatile memory device of claim 18, wherein the second program loop is a program loop at least one program loop after the first program loop.

20. The nonvolatile memory device of claim 18, wherein if the counting result indicates that a programming of a program state corresponding to the first verify voltage is completed, the second program loop is a program loop immediately following the first program loop.

* * * * *